(12) United States Patent
Yoshida

(10) Patent No.: US 11,373,886 B2
(45) Date of Patent: Jun. 28, 2022

(54) SUBSTRATE PROCESSING APPARATUS AND SUBSTRATE PROCESSING METHOD

(71) Applicant: Tokyo Electron Limited, Tokyo (JP)

(72) Inventor: Hiroshi Yoshida, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/830,512

(22) Filed: Mar. 26, 2020

(65) Prior Publication Data

US 2020/0312682 A1 Oct. 1, 2020

(30) Foreign Application Priority Data

Mar. 29, 2019 (JP) .............................. JP2019-067889

(51) Int. Cl.
*H01L 21/67* (2006.01)
*H01L 21/311* (2006.01)
*B01F 31/00* (2022.01)

(52) U.S. Cl.
CPC ........ *H01L 21/67086* (2013.01); *B01F 31/00* (2022.01); *H01L 21/31111* (2013.01); *H01L 21/67017* (2013.01)

(58) Field of Classification Search
None
See application file for complete search history.

(56) References Cited

U.S. PATENT DOCUMENTS

| 6,431,183 B1* | 8/2002 | Konishi | .................. C01B 13/10 134/1.3 |
| 2010/0175714 A1* | 7/2010 | Nagai | ..................... G03F 7/423 134/3 |
| 2012/0074102 A1* | 3/2012 | Magara | ............. H01L 21/31111 216/83 |

(Continued)

FOREIGN PATENT DOCUMENTS

| JP | H06-275829 A | 9/1994 |
| JP | 2016-032030 A | 3/2016 |

(Continued)

OTHER PUBLICATIONS

Machine Generated English Translation of the abstractor JP2017118092A. Published Jun. 29, 2017 (Year: 2017).*

(Continued)

*Primary Examiner* — Sylvia Macarthur
(74) *Attorney, Agent, or Firm* — Venjuris, P.C.

(57) ABSTRACT

A substrate processing apparatus includes: a mixer that mixes a first phosphoric acid and an additive serving as raw materials of a processing liquid with each other at a predetermined mixing ratio, thereby preparing a mixed liquid; a mixing ratio corrector that corrects the mixing ratio of the raw materials of the processing liquid; a processing unit that processes a substrate with the processing liquid. The mixer includes a mixing tank that stores the mixed liquid, a first phosphoric acid supply that supplies the first phosphoric acid to the mixing tank, and an additive supply that supplies the additive to the mixing tank. The mixing ratio corrector (Continued)

includes a liquid line through which the mixed liquid is delivered from the mixer to the processing unit, and a second phosphoric acid supply connected to the liquid line so as to supply second phosphoric acid to the liquid line.

16 Claims, 8 Drawing Sheets

(56) References Cited

U.S. PATENT DOCUMENTS

| | | | | |
|---|---|---|---|---|
| 2014/0073069 | A1* | 3/2014 | Takami | H01L 21/32134 |
| | | | | 438/14 |
| 2015/0262737 | A1* | 9/2015 | Hinode | H01L 21/67017 |
| | | | | 216/83 |
| 2016/0093515 | A1* | 3/2016 | Namba | H01L 21/6708 |
| | | | | 156/345.15 |
| 2016/0368030 | A1* | 12/2016 | Kim | H01L 22/26 |
| 2017/0062242 | A1* | 3/2017 | Kim | H01L 21/67017 |
| 2018/0033651 | A1* | 2/2018 | Hayashi | H01L 21/6715 |
| 2018/0277454 | A1* | 9/2018 | Kurasaki | H01L 21/67253 |
| 2019/0122906 | A1* | 4/2019 | Zhang | H01L 21/67017 |
| 2020/0312682 | A1* | 10/2020 | Yoshida | H01L 21/31111 |

FOREIGN PATENT DOCUMENTS

| | | | |
|---|---|---|---|
| JP | 2017-118092 A | | 6/2017 |
| JP | 2017118092 A | * | 6/2017 |
| JP | 2017-195338 A | | 10/2017 |
| JP | 2018-139259 A | | 9/2018 |
| WO | 2017/169602 A1 | | 10/2017 |

OTHER PUBLICATIONS

Machine Generated English Translation of the claims of JP2017118092A. Published Jun. 29, 2017 (Year: 2017).*

Machine Generated English Translation of the description of JP2017118092A. Published Jun. 29, 2017 (Year: 2017).*

* cited by examiner

MIXING RATIO BETWEEN FIRST PHOSPHORIC ACID AND SILICA PRECIPITATION INHIBITOR (M:N=q2:q1)

MIXING RATIO BETWEEN PHOSPHORIC ACID (FIRST PHOSPHORIC ACID OR SECOND PHOSPHORIC ACID) AND SILICA PRECIPITATION INHIBITOR (q2+Q2:q1)

US 11,373,886 B2

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2019-067889, filed on Mar. 29, 2019, with the Japan Patent Office, the disclosure of which is incorporated herein in its entirety by reference.

TECHNICAL FIELD

The present disclosure relates to a substrate processing apparatus and a substrate processing method.

BACKGROUND

The substrate processing apparatus described in Japanese Laid-Open Patent Publication No. 2017-118092 includes a processing unit, a circulation line, a heater, and a first injector. The processing unit removes a silicon nitride film from a substrate, using an etching liquid containing phosphoric acid and a silica precipitation inhibitor. The circulation line circulates the etching liquid with respect to the processing unit. The heater heats the etching liquid. The first injector is provided in the circulation line, and injects the silica precipitation inhibitor into the etching liquid.

SUMMARY

According to an aspect of the present disclosure, a substrate processing apparatus includes: a mixer configured to mix first phosphoric acid and an additive serving as raw materials of a processing liquid with each other at a predetermined mixing ratio, thereby preparing a mixed liquid; a mixing ratio corrector configured to correct the mixing ratio of the raw materials of the processing liquid; and a processing unit configured to process a substrate with the processing liquid, in which the mixer includes a mixing tank that stores the mixed liquid, a first phosphoric acid supply that supplies the first phosphoric acid to the mixing tank, and an additive supply that supplies the additive to the mixing tank, and the mixing ratio corrector includes a liquid line through which the mixed liquid is delivered from the mixer to the processing unit, and a second phosphoric acid supply connected to the liquid line so as to supply second phosphoric acid to the liquid line.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
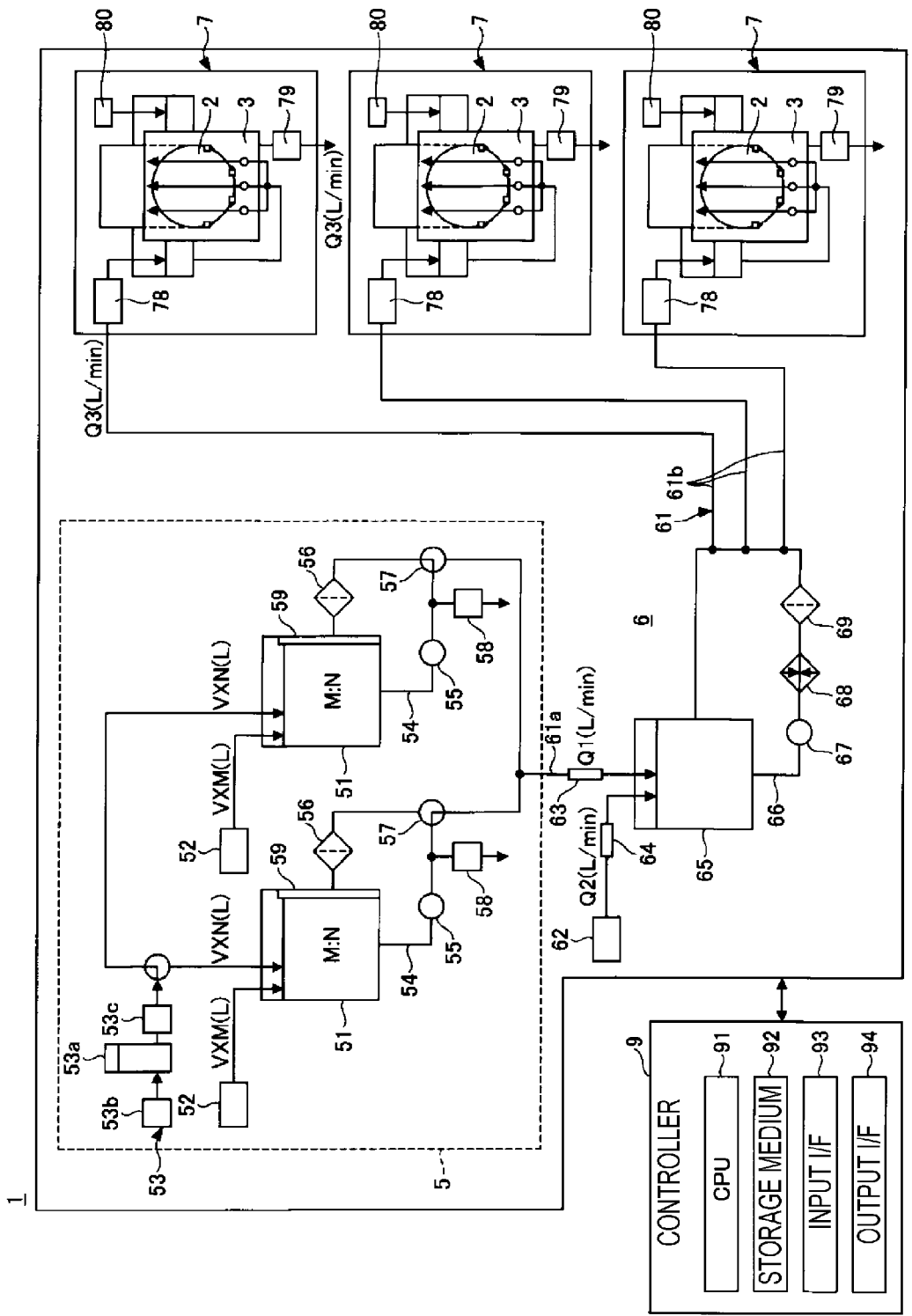
FIG. 1 is a view illustrating a substrate processing apparatus according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of the present disclosure will be described with reference to the accompanying drawings. In addition, in the respective drawings, the same or corresponding components will be denoted by the same reference numerals, and overlapping descriptions thereof will be omitted.

Figure 2:
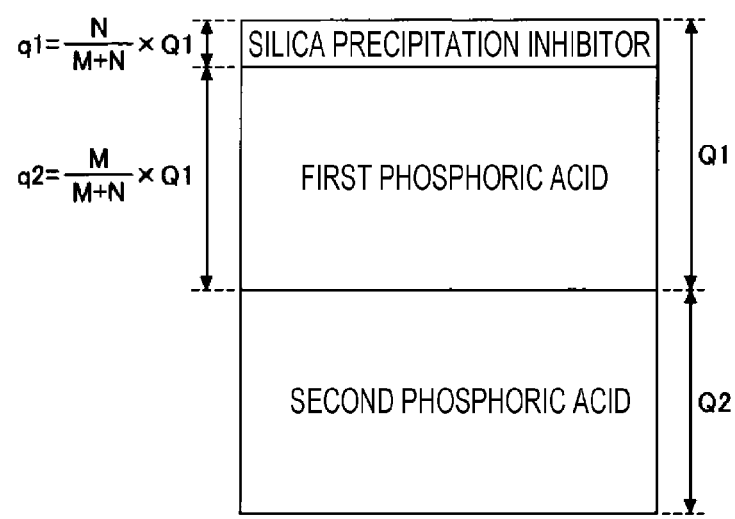
FIG. 2 is a view illustrating a mixing ratio of raw materials of a processing liquid according to an embodiment.
Figure 3A:
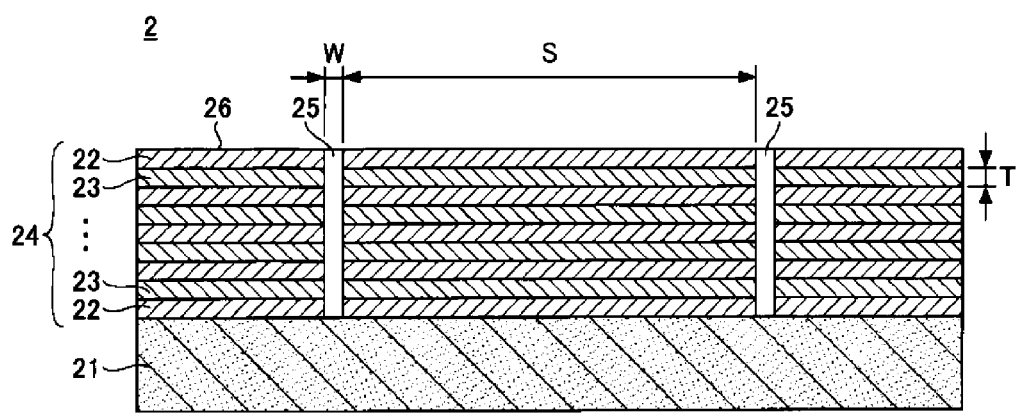
FIG. 3A is a cross-sectional view illustrating a state of a substrate before the substrate is processed according to the embodiment.
Figure 3B:
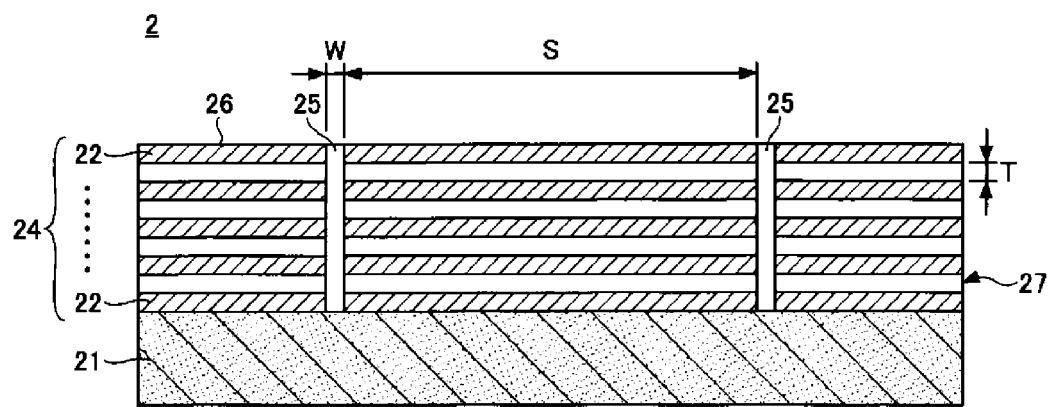
FIG. 3B is a cross-sectional view illustrating a state of the substrate illustrated in FIG. 3A after the substrate is processed.

FIG. 1 is a view illustrating a substrate processing apparatus according to an embodiment. FIG. 2 is a view illustrating a mixing ratio of raw materials of a processing liquid according to the embodiment. FIG. 3A is a cross-sectional view illustrating a state of a substrate before the substrate is processed according to the embodiment. FIG. 3B is a cross-sectional view illustrating a state of the substrate illustrated in FIG. 3A after the substrate is processed.

A substrate processing apparatus 1 processes a substrate 2 with a processing liquid 3. As illustrated in FIG. 3A, the substrate 2 includes, for example, a silicon wafer 21, a silicon oxide film 22, and a silicon nitride film 23. The silicon oxide film 22 and the silicon nitride film 23 are alternately and repeatedly stacked, such that a stacked film 24 is formed. A conductive film (not illustrated) or the like is formed between the stacked film 24 and the silicon wafer 21. The stacked film 24 includes an opening 25 that penetrates the stacked film 24 in the thickness direction of the stacked film 24.

The processing liquid 3 contains phosphoric acid, and enters the opening 25 of the stacked film 24 to selectively etch the silicon nitride film 23 from the silicon oxide film 22 and the silicon nitride film 23 and remove the silicon nitride film 23 as illustrated in FIG. 3B. The etching selectivity is determined by, for example, a silicon concentration in the processing liquid 3. As the silicon concentration is high, the selectivity is improved. Meanwhile, when the silicon concentration exceeds a saturation concentration, silica is precipitated. Thus, the processing liquid 3 contains a silica precipitation inhibitor. The silica precipitation inhibitor is a general additive that inhibits the precipitation of silica.

The processing liquid 3 enters the opening 25 of the stacked film 24, and etches the silicon nitride film 23 in the in-plane direction of the silicon nitride film 23. The in-plane direction refers to a direction orthogonal to the thickness direction. As the etching of the silicon nitride film 23 is progressed, silicon is eluted inside the stacked film 24. The eluted silicon mainly diffuses due to the silicon concentration gradient, and diffuses outside the stacked film 24 through the opening 25 of the stacked film 24. As the depth from the surface 26 of the stacked film 24 increases, and as the distance from the opening 25 increases, the diffusion distance increases, and thus, the silicon concentration becomes relatively high.

As described above, the silicon concentration varies according to positions, and the highest value of the silicon concentration is determined according to a pattern 27 of the substrate 2 to be processed with the processing liquid 3. The pattern 27 to be processed refers to a pattern to be removed, that is, a pattern of a passage through which the eluted silicon diffuses. The pattern 27 is three-dimensional.

The pattern 27 of the substrate 2 includes the number of stacked layers in the stacked film 24 and an interval S between openings 25. As the number of stacked layers in the stacked film 24 increases, and as the interval S between the openings 25 is large, the diffusion distance increases, and thus, the highest value of the silicon concentration increases.

Further, the pattern 27 of the substrate 2 includes a film thickness T of each silicon nitride film 23 and a width W of each opening 25. As the film thickness T of each silicon nitride film 23 is small, and as the width W of each opening 25 is narrow, the width of the passage through which silicon diffuses becomes narrow, and thus, the highest value of the silicon concentration increases.

As described above, the highest value of the silicon concentration is determined according to the pattern 27 of the substrate 2. Thus, the substrate processing apparatus 1 changes the concentration of the silica precipitation inhibitor contained in the processing liquid 3, based on the pattern 27 of the substrate 2. For example, as the highest value of the silicon concentration increases, the concentration of the silica precipitation inhibitor is made high. As a result, the precipitation of silica may be inhibited.

As illustrated in FIG. 1, the substrate processing apparatus 1 includes, for example, a mixing section 5, a mixing ratio correction section 6, and a processing unit 7. The mixing section 5 mixes first phosphoric acid and the silica precipitation inhibitor which are raw materials of the processing liquid 3 with each other at a predetermined first mixing ratio (M:N), to prepare a mixed liquid. The mixing ratio correction section 6 corrects the mixing ratio of the raw materials of the processing liquid 3. Specifically, the mixing ratio correction section 6 mixes the mixed liquid and second phosphoric acid at a predetermined second mixing ratio (Q1:Q2), to prepare the processing liquid 3. The mixing ratio correction section 6 prepares the processing liquid 3 that contains both the mixed liquid and the second phosphoric acid or the processing liquid 3 that contains only the mixed liquid. The processing unit 7 processes the substrate 2 with the processing liquid 3.

The mixing section 5 includes a mixing tank 51, a first phosphoric acid supply 52, and a first additive supply 53. The mixing tank 51 stores the mixed liquid. The first phosphoric acid supply 52 supplies the first phosphoric acid to the mixing tank 51. The first phosphoric acid is supplied in a form of, for example, an aqueous solution. The first additive supply 53 supplies the silica precipitation inhibitor to the mixing tank 51. The silica precipitation inhibitor is supplied in form of, for example, an aqueous solution.

The first additive supply 53 includes, for example, a measuring tank 53$a$, a first pump 53$b$, and a second pump 53$c$. The measuring tank 53$a$ stores the silica precipitation inhibitor. The first pump 53$b$ supplies the silica precipitation inhibitor to the measuring tank 53$a$. The second pump 53$c$ takes the silica precipitation inhibitor in a predetermined amount V out from the measuring tank 53$a$, and supplies the taken-out silica precipitation inhibitor to the mixing tank 51. By changing the number of times of the supply N, it is possible to change the first mixing ratio (M:N). The amount of the first phosphoric acid to be supplied to the mixing tank 51, that is, V×M is constant, and the amount of the silica precipitation inhibitor to be supplied to the mixing tank 51, that is, V×N is variable. In addition, the pumping of the silica precipitation inhibitor may be a pumping of $N_2$.

The mixing section 5 may include a circulation line 54, and the circulation line 54 returns the mixed liquid that has been taken out from the mixing tank 51, to the mixing tank 51. Further, the mixing section 5 may include a circulation pump 55 and a circulation filter 56 in the middle of the circulation line 54. The circulation pump 55 pumps the mixed liquid. The circulation filter 56 collects particles included in the mixed liquid.

The mixing section 5 may include a direction switching valve 57 in the middle of the circulation line 54. The direction switching valve 57 switches the direction in which the mixed liquid flows, between a first direction in which the mixed liquid returns to the mixing tank 51 and a second direction in which the mixed liquid is sent to the mixing ratio correction section 6. Since both of the flow directed toward the first direction and the flow directed toward the second direction may be formed by the circulation pump 55, the number of pumps may be reduced.

The mixing section 5 may include a draining unit 58, and the draining unit 58 discharges the mixed liquid from the mixing tank 51 to the outside of the substrate processing apparatus 1. When the first mixing ratio (M:N) is changed, a mixed liquid with a previous first mixing ratio (M:N) may be discharged from the mixing tank 51, and then, a mixed liquid with a new first mixing ratio (M:N) may be prepared in the mixing tank 51.

The mixing section 5 may include a residual liquid measuring unit 59, and the residual liquid measuring unit 59 measures an amount of the mixed liquid residual in the mixing tank 51. When the amount of the residual liquid is measured, the mixed liquid may be supplied to the mixing tank 51 at an appropriate timing before the mixing tank 51 becomes empty.

The mixing section 5 may include a plurality of mixing tanks 51. As described in detail later, the roles of the plurality of mixing tanks 51 are switched, so that the plurality of mixing tanks 51 are prevented from becoming empty at the same time, and further, the processing of the substrate 2 is prevented from being interrupted due to the shortage of the mixed liquid. Further, the processing of the substrate 2 may be continuously performed in the mixing tanks 51 each having a small volume.

The mixing ratio correction section 6 includes a liquid sending line 61 and a second phosphoric acid supply 62. The liquid sending line 61 sends the mixed liquid from the mixing section 5 to the processing unit 7. The second phosphoric acid supply 62 supplies the second phosphoric acid in the middle of the liquid sending line 61. The second phosphoric acid is supplied in a form of, for example, an aqueous solution. The phosphoric acid concentration of the second phosphoric acid aqueous solution and the phosphoric acid concentration of the first phosphoric acid aqueous solution are the same, but may be different from each other. As a result of the supply of the second phosphoric acid, the silica precipitation inhibitor is diluted, and the processing liquid 3 with the relatively low ratio of the silica precipitation inhibitor is prepared.

The mixing ratio correction section 6 includes a first flow meter 63 and a second flow meter 64. The first flow meter 63 measures a flow rate Q1 of the mixed liquid before the mixed liquid and the second phosphoric acid merge with each other. The flow rate Q1 is the sum of a flow rate q1 of the silica precipitation inhibitor and a flow rate q2 of the first phosphoric acid (see FIG. 2). The flow rate ratio (q2:q1) of the first phosphoric acid and the silica precipitation inhibitor is the same as the first mixing ratio (M:N). The second flow meter 64 measures a flow rate Q2 of the second phosphoric acid before the mixed liquid and the second phosphoric acid merge with each other.

The mixing ratio correction section 6 may include a buffer tank 65 in the middle of the liquid sending line 61. The buffer tank 65 temporarily stores the mixed liquid and the second phosphoric acid. As a result of the storage, a mixing ununiformity between the mixed liquid and the second phosphoric acid may be reduced, so that the mixing ratio (q2+Q2:q1) of the phosphoric acid and the silica precipitation inhibitor may be stabilized.

The mixing ratio correction section 6 may include a circulation line 66 that returns the processing liquid 3 that has been taken out from the buffer tank 65, to the buffer tank 65. The mixing ratio correction section 6 may include a circulation pump 67, a temperature regulator 68, and a circulation filter 69 in the middle of the circulation line 66. The circulation pump 67 pumps the processing liquid 3. The temperature regulator 68 regulates the temperature of the processing liquid 3. For example, the temperature regulator 68 includes a heater that heats the processing liquid 3. The temperature of the processing liquid 3 is set to, for example, the boiling point of the processing liquid 3. In addition, the temperature regulator 68 may further include a cooler that cools the processing liquid 3. The circulation filter 69 collects particles included in the processing liquid 3.

The liquid sending line 61 includes an upstream line 61a and a plurality of downstream lines 61b. The upstream line 61a connects the plurality of mixing tanks 51 and the buffer tank 65 to each other, and the plurality of downstream lines 61b connect the buffer tank 65 and a plurality of processing units 7 to each other. Since the plurality of downstream lines 61b individually send the mixed liquid to the plurality of processing units 7, each downstream line 61b is able to change the flow rate of the processing liquid 3 for each processing unit 7. The downstream lines 61b illustrated in FIG. 1 correspond to individual lines described in the claims hereinbelow. The plurality of downstream lines 61b individually extend from the circulation line 66 to the processing units 7.

Figure 11:
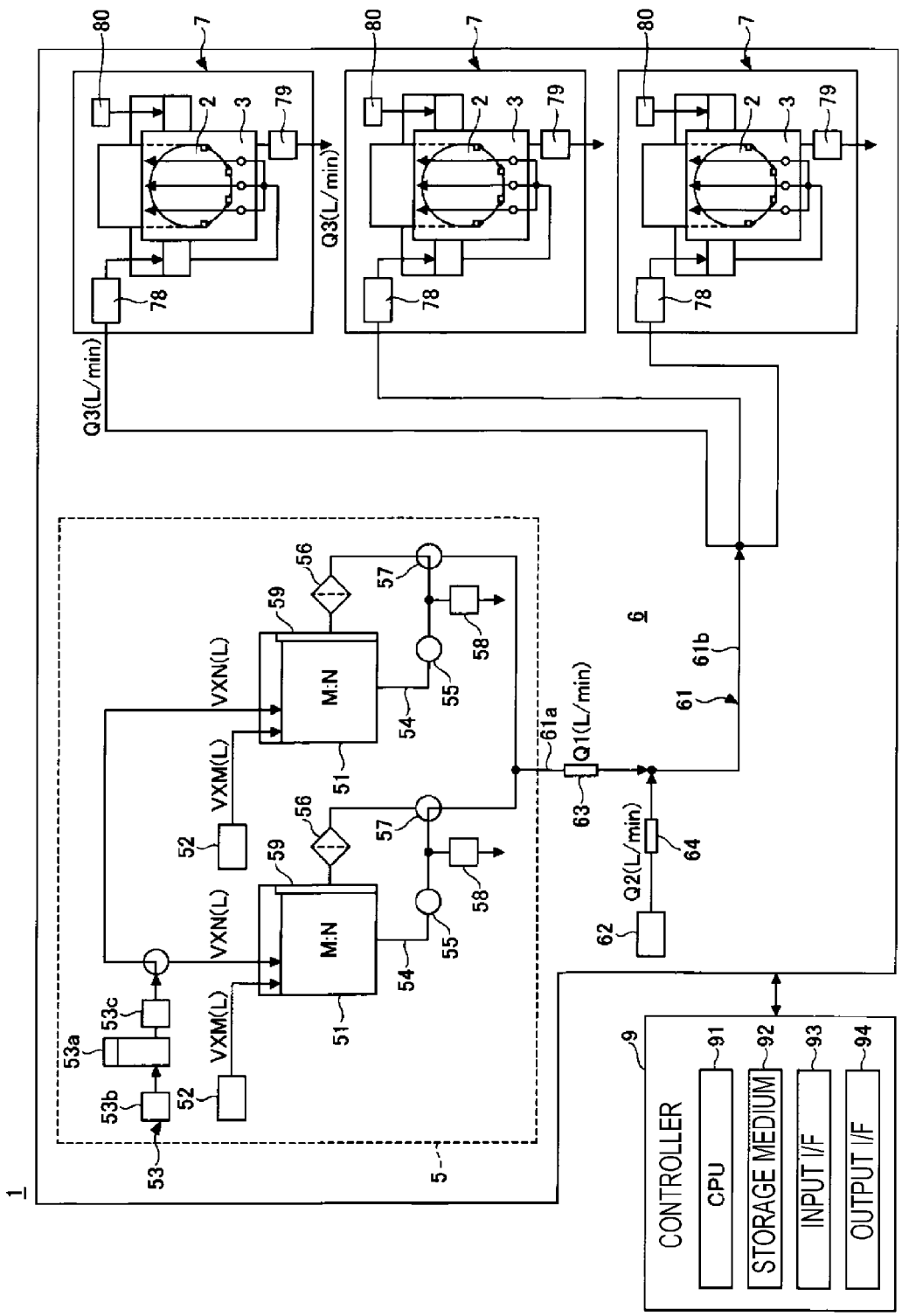
FIG. 11 is a view illustrating a substrate processing apparatus according to a modification.

In addition, the mixing ratio correction section 6 includes the buffer tank 65 as illustrated in FIG. 1, but may not include the buffer tank 65 as illustrated in FIG. 11. The second phosphoric acid supply 62 illustrated in FIG. 11 supplies the second phosphoric acid at the connection point between the upstream line 61a and a single downstream line 61b. The second phosphoric acid flows along the downstream line 61b, together with the first phosphoric acid and the silica precipitation inhibitor. The downstream line 61b branches from the middle thereof, and extends to the plurality of processing units 7.

Figure 4:
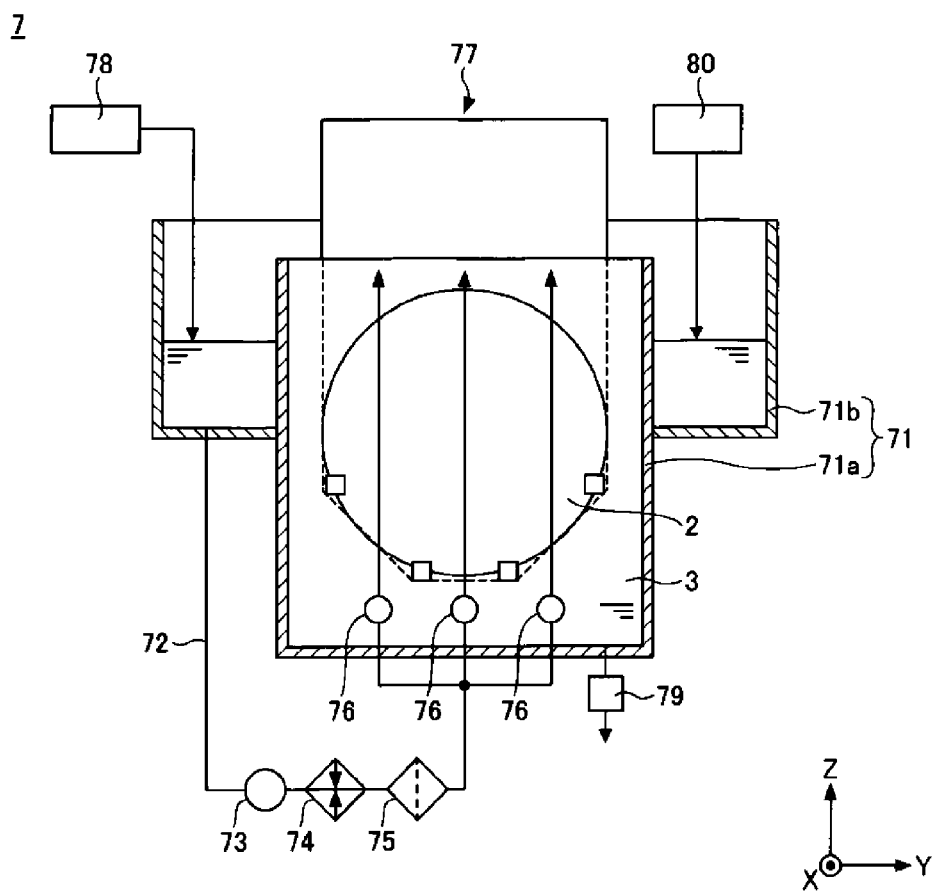
FIG. 4 is a view illustrating a processing unit according to the embodiment.

FIG. 4 is a view illustrating a processing unit according to the embodiment. In FIG. 4, the X-axis direction, the Y-axis direction, and the Z-axis direction are perpendicular to one another. The X-axis direction and the Y-axis direction are horizontal directions, and the Z-axis direction is a vertical direction.

The processing unit 7 is, for example, a batch-type processing unit that simultaneously processes a plurality of substrates 2 with the processing liquid 3, and includes a processing tank 71. The processing tank 71 stores the processing liquid 3, and the plurality of substrates 2 are immersed in the processing liquid 3 stored in the processing tank 71, and processed by the processing liquid 3.

The processing tank 71 is, for example, a double tank, and includes an inner tank 71a that stores the processing liquid 3 and an outer tank 71b that collects the processing liquid 3 overflowing from the inner tank 71a. The plurality of substrates 2 are immersed in the processing liquid 3 inside the inner tank 71a, and processed by the processing liquid 3.

The processing unit 7 includes a circulation line 72, and the circulation line 72 sends the processing liquid 3 taken out from the outer tank 71b, to the inner tank 71a. Further, the processing unit 7 includes a circulation pump 73, a temperature regulator 74, and a circulation filter 75 in the middle of the circulation line 72. The circulation pump 73 pumps the processing liquid 3. The temperature regulator 74 regulates the temperature of the processing liquid 3. For example, the temperature regulator 74 includes a heater that heats the processing liquid 3. The temperature of the processing liquid 3 is set to, for example, the boiling point of the processing liquid 3. In addition, the temperature regulator 74 may further include a cooler that cools the processing liquid 3. The circulation filter 75 collects particles included in the processing liquid 3.

The processing unit 7 includes a plurality of horizontal pipes 76 inside the inner tank 71a, and the horizontal pipes 76 supply the processing liquid 3 sent from the circulation line 72 into the inner tank 71a. The plurality of horizontal pipes 76 extend in the X-axis direction, and are arranged at intervals in the Y-axis direction. Each of the plurality of horizontal pipes 76 has a plurality of ejection holes at intervals in the longitudinal direction thereof, and the plurality of ejection holes eject the processing liquid 3 directly upward. Thus, a curtain-shaped upward flow may be formed inside the inner tank 71a.

The processing unit 7 includes a substrate holder 77, and the substrate holder 77 moves up and down between a standby position and a processing position while holding the plurality of substrates 2 at intervals in the X-axis direction. The standby position refers to a position where the plurality of substrates 2 are transferred to a transfer device (not illustrated), and is set to a position above the processing position. The processing position refers to a position where the plurality of substrates 2 are immersed in the processing liquid 3. The substrate holder 77 receives unprocessed substrates 2 from the transfer device at the standby position, and subsequently, moves down to the processing position. After a predetermined time elapses, the substrate holder 77 moves up to the standby position, and transfers the processed substrates 2 to the transfer device at the standby position. Thereafter, the same operation is repeated.

Since the etching of the silicon nitride film 23 is progressed during the processing of the substrates 2, silicon is gradually eluted from the substrates 2. Thus, in order to keep the silicon concentration within an allowable range, the replacement of a previous processing liquid 3 with a new processing liquid 3, that is, the supply of the new processing liquid 3 and the discharge of the previous processing liquid 3 are performed, during the processing of the substrates 2.

The processing unit 7 includes a liquid supply 78, and the liquid supply 78 introduces the new processing liquid 3 from the mixing ratio correction section 6 to the processing unit 7. The liquid supply 78 includes, for example, an opening/closing valve and a flow rate controller. When the opening/closing valve is opened, the new processing liquid 3 is supplied to the processing unit 7. The supply amount is controlled by the flow rate controller.

Further, the processing unit 7 includes a drain unit 79, and the drain unit 79 discharges the previous processing liquid 3 from the processing unit 7. The drain unit 79 includes, for example, an opening/closing valve and a flow rate controller. When the opening/closing valve is opened, the previous processing liquid 3 is discharged from the processing unit 7. The discharge amount is controlled by the flow rate controller.

During the processing of the substrates 2, a flow rate Q3 (L/min) of the new processing liquid 3 supplied to the processing unit 7 may be the same as a flow rate Q3 (L/min) of the previous processing liquid 3 discharged from the processing unit 7. Since the new processing liquid 3 and the previous processing liquid 3 are replaced with each other in the equal amount, the amount of the liquid in the processing tank 71 may be kept constant.

The silicon concentration of the new processing liquid 3 is lower than a target concentration (% by volume), and is, for example, zero. Meanwhile, the silicon concentration of the previous processing liquid 3 is, for example, the target concentration. The product of the difference in silicon concentration between the new processing liquid 3 and the previous processing liquid 3, and the flow rate Q3 is the flow rate of silicon discharged from the processing unit 7. The flow rate is the same as the flow rate of silicon eluted from the substrates 2 in the processing unit 7. As a result, the silicon concentration of the processing liquid 3 may be kept within the allowable range.

The processing unit 7 includes a second additive supply 80, and the second additive supply 80 supplies a silicon concentration regulating agent to the processing tank 71. The silicon concentration regulating agent is an additive for regulating the silicon concentration of the processing liquid 3. The silicon concentration regulating agent is a general additive such as a silicon compound. The silicon concentration regulating agent is supplied in a form of an aqueous solution.

The second additive supply 80 supplies the silicon concentration regulating agent to the processing tank 71, for example, after the new processing liquid 3 is supplied to the empty processing tank 71, and before the substrates 2 are processed with the new processing liquid 3. Since the silicon concentration of the new processing liquid 3 is lower than the target concentration as described above, the silicon concentration of the processing liquid 3 may be increased to the target concentration by supplying the silicon concentration regulating agent to the processing tank 71, so that the selectivity may be improved.

The controller 9 is, for example, a computer, and includes a CPU (central processing unit) 91 and a storage medium 92 such as a memory as illustrated in FIG. 1. The storage medium 92 stores programs for controlling various processes performed in the substrate processing apparatus 1. The controller 9 causes the CPU to execute the programs stored in the storage medium 92, so as to control the operation of the substrate processing apparatus 1. Further, the controller 9 includes an input interface 93 and an output interface 94. The controller 9 receives a signal from the outside via the input interface 93, and transmits a signal to the outside via the output interface 94.

The programs described above are stored in, for example, a computer-readable storage medium, and installed from the storage medium into the storage medium 92 of the controller 9. Examples of the computer-readable storage medium may include a hard disk (HD), a flexible disk (FD), a compact disk (CD), a magnet optical disk (MO), and a memory card. In addition, the programs may be downloaded from a server via the Internet, and installed in the storage medium 92 of the controller 9.

Figure 5:
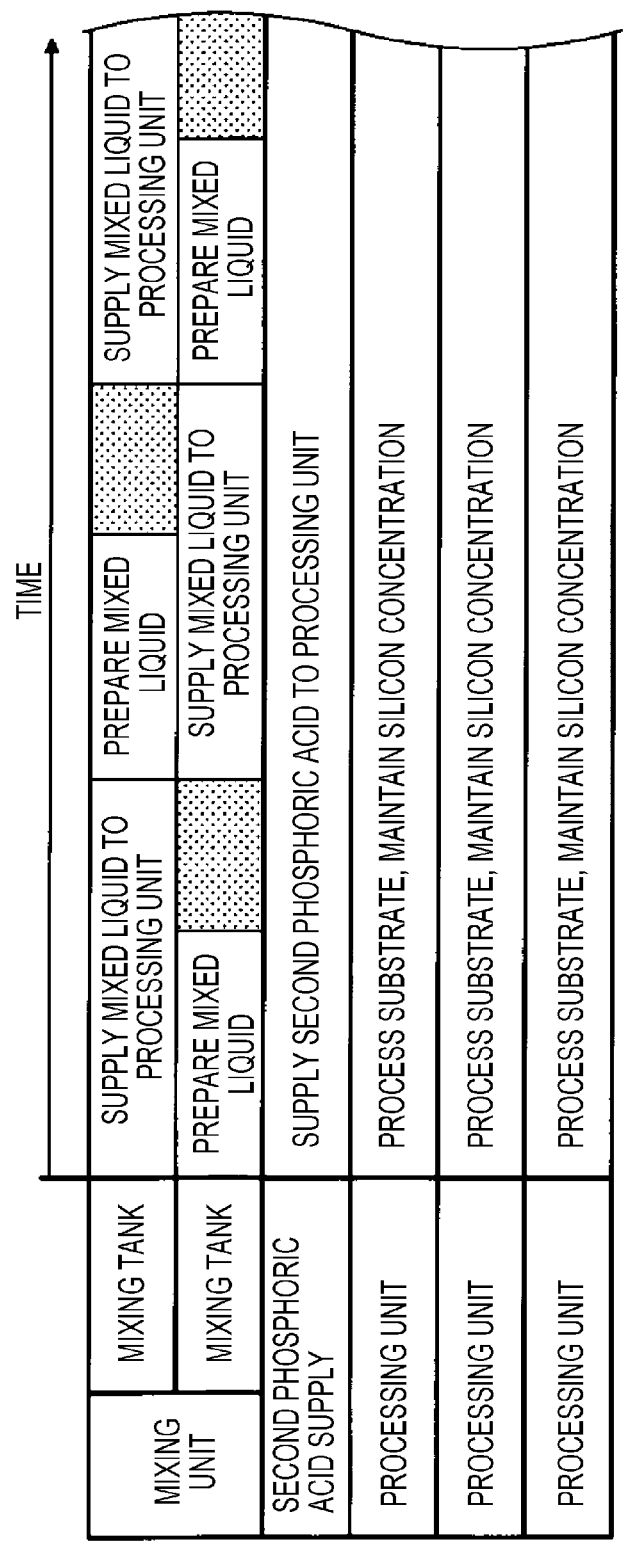
FIG. 5 is a view illustrating an operation of the substrate processing apparatus according to the embodiment.

FIG. 5 is a view illustrating the operation of the substrate processing apparatus according to the embodiment. As illustrated in FIG. 5, the plurality of processing units 7 perform the processing of the substrates 2, and also perform maintaining the silicon concentration. The maintaining of the silicon concentration includes the replacement of the previous processing liquid 2 with the new processing liquid 3, that is, the supply of the new processing liquid 3 and the discharge of the previous processing liquid 3.

In order to supply the new processing liquid 3 to the plurality of processing units 7, the mixing section 5 takes a prepared mixed liquid from one mixing tank 51, and sends the prepared mixed liquid toward the processing units 7. Further, in order to supply the new processing liquid 3 to the processing units 7, the second phosphoric acid supply 62 supplies the second phosphoric acid to the middle of the liquid sending line 61. The second phosphoric acid, the first phosphoric acid, and the silica precipitation inhibitor are mixed with one another in the middle of the liquid sending line 61, and sent as the processing liquid to the processing units 7.

While taking the prepared mixed liquid out from one mixing tank 51 and sending the prepared mixed liquid toward the processing units 7, the mixing section 5 prepares a mixed liquid in another mixing tank 51. Since the roles of the plurality of mixing tanks 51 are switched, the plurality of mixing tanks 51 are prevented from becoming empty at the same time, so that the processing of the substrates 2 is prevented from being interrupted due to the shortage of the mixed liquid. Further, the processing of the substrates 2 may be continuously performed in the mixing tanks 51 each having the small volume.

In addition, the mixing section 5 switches sending the prepared mixed liquid toward the processing units 7, among the plurality of mixing tanks 51 in a predetermined order. Since the roles of the plurality of mixing tanks 51 are switched, the plurality of mixing tanks 51 may be prevented from becoming empty at the same time, so that the processing of the substrates 2 may be prevented from being interrupted due to the shortage of the mixed liquid. Further, the processing of the substrates 2 may be continuously performed in the mixing tanks 51 each having the small volume.

Figure 6:
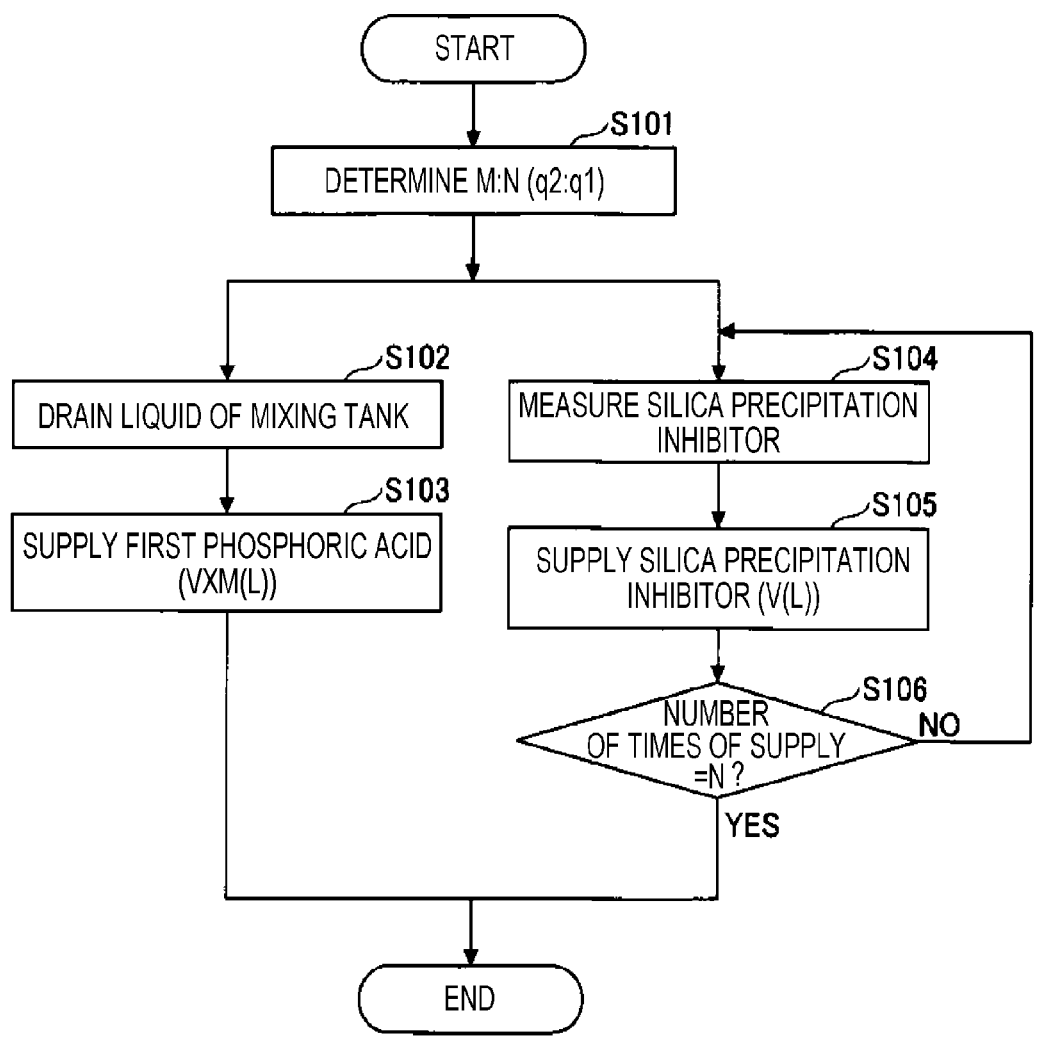
FIG. 6 is a flowchart illustrating a preparation of a mixed liquid according to the embodiment.

FIG. 6 is a flowchart illustrating the preparation of the mixed liquid according to the embodiment. When an instruction to prepare the mixed liquid is received, the controller 9 performs the processes illustrated in FIG. 6. The instruction to prepare the mixed liquid is generated when the amount of the mixed liquid remaining in a mixing tank 51 falls below a threshold. The instruction to prepare the mixed liquid is also generated when the first mixing ratio (M:N) is changed.

First, the controller 9 determines the first mixing ratio (M:N) based on, for example, the pattern 27 of a substrate 2 (S101).

An optimum value for the mixing ratio of the raw materials of the processing liquid 3, for example, the mixing ratio of the phosphoric acid and the silica precipitation inhibitor differs for each pattern 27. Thus, the mixing ratio of the raw materials of the processing liquid 3 is determined in advance by, for example, an experiment for each pattern 27, and stored in advance in the storage medium 92. Hereinafter, the mixing ratio of the raw materials of the processing liquid 3 is expressed with the ratio of the phosphoric acid M fixed.

The mixing ratio of the raw materials of the processing liquid 3 may depend on processing conditions other than the pattern 27. The processing conditions include (1) conditions that may be changed by a user of the substrate processing apparatus 1, that is, conditions that may be input to the controller 9 by the user, and (2) conditions that may not be changed by the user of the substrate processing apparatus 1, that is, conditions that are determined by the structure of the substrate processing apparatus 1. (1) The conditions that may be input to the controller 9 by the user are, for example, a processing time of the substrate 2 and the number of substrates 2 per batch, other than the pattern 27 of the substrate 2. (2) The conditions that are determined by the structure of the substrate processing apparatus 1 are, for example, the volume of a processing tank 71, the number of processing tanks 71, the volume of a mixing tank 51, the number of mixing tanks 51, and the maximum flow rate of the liquid sending line 61. The maximum flow rate of the liquid sending line 61 is determined by, for example, the length or diameter of the line.

As described above, the mixing ratio of the phosphoric acid and the silica precipitation inhibitor may depend on processing conditions of the substrates 2 other than the pattern 27 of each substrate 2. Thus, the mixing ratio of the raw materials of the processing liquid 3 is determined in advance by, for example, an experiment for each processing condition of the substrates 2, and stored in advance in the storage medium 92. In this case, the controller 9 determines the first mixing ratio (M:N) based on the processing conditions of the substrates 2 (S101).

Specifically, the controller 9 determines a mixing ratio having the highest ratio of the silica precipitation inhibitor, among a plurality of mixing ratios stored in advance, to be the first mixing ratio (M:N). This is because the ratio of the silica precipitation inhibitor may be reduced by supplying the second phosphoric acid as described later. Since the mixing ratio with the highest ratio of the silica precipitation inhibitor is determined to be the first mixing ratio (M:N), the first mixing ratio (M:N) does not need to be frequently changed, so that the waste amount of the mixed liquid may be reduced.

Meanwhile, when the pattern 27 of a substrate 2 is updated, and for example, the number of stacked layers of the stacked film 24 increases in order to manufacture a new-generation semiconductor device, the highest value of the silicon concentration increases as described above, and hence, the optimal ratio of the silica precipitation inhibitor increases. In this case, the optimum mixing ratio is newly determined by, for example, an experiment, and newly stored in the storage medium 92. The mixing ratio of the phosphoric acid and the silica precipitation inhibitor is also a condition that may be input to the controller 9 by the user.

As described above, the controller 9 determines the first mixing ratio (M:N) based on the pattern 27 of a substrate 2 (S101). Further, as described above, the controller 9 determines a mixing ratio with the highest ratio of the silica precipitation inhibitor, among the plurality of mixture ratios stored in advance, to be the first mixing ratio (M:N). By appropriately updating the first mixing ratio (M:N), it is possible to manufacture the new-generation semiconductor device, and further, it is possible to prevent the life of the substrate processing apparatus 1 from being ended due to the shift of the generation of the semiconductor device.

After the first mixing ratio (M:N) is determined (S101), the controller 9 performs draining the liquid from the mixing tank 51 (S102). In a case where the first mixing ratio (M:N) is changed, the draining of the liquid is performed until the mixed liquid with the previous first mixing ratio (M:N) no longer exists. Meanwhile, in a case where the first mixing ratio (M:N) is not changed, the draining of the liquid is performed to the extent that the V×M (L) of first phosphoric acid and the V×N (L) of silica precipitation inhibitor may be supplied to the mixing tank 51 at a later time. After the liquid is drained from the mixing tank 51 (S102), the controller 9 supplies the V×M (L) of first phosphoric acid to the mixing tank 51 (S103).

During the draining of the liquid from the mixing tank 51 (S102), the controller 9 performs at least a portion of a process of measuring the silica precipitation inhibitor (S104). The measuring of the silica precipitation inhibitor (S104) includes injecting the silica precipitation inhibitor into the measuring tank 53a. Since the draining of the liquid from the mixing tank 51 (S102) and at least a portion of the process of measuring the silica precipitation inhibitor (S104) are simultaneously performed, the time required for preparing the mixed liquid may be reduced.

After the silica precipitation inhibitor is measured (S104), the controller 9 takes the V (L) of silica precipitation inhibitor out from the measuring tank 53a, and supplies the taken-out silica precipitation inhibitor to the mixing tank 51 (S105). Then, the controller 9 checks the cumulative number of times of the supply (S106). When it is determined that the number of times of the supply is less than N (S106, NO), the amount of the supplied silica precipitation inhibitor is insufficient, and hence, the controller 9 returns to S104 to repeat S104 and the subsequent processes thereof. Meanwhile, when it is determined that the number of times of the supply is N (S106, YES), the supply of the V×N (L) of silica precipitation inhibitor has been completed, and thus, the controller 9 ends the present process.

In addition, the controller 9 may start to circulate the mixed liquid after the draining of the liquid from the mixing tank 51 (S102) is ended. As a result of the circulation of the mixed liquid, the mixing ununiformity may be reduced. The circulation of the mixed liquid is performed until a predetermined time elapses from the end of the supply of the first phosphoric acid and the silica precipitation inhibitor. Particles included in the mixed liquid may be removed.

Figure 7:
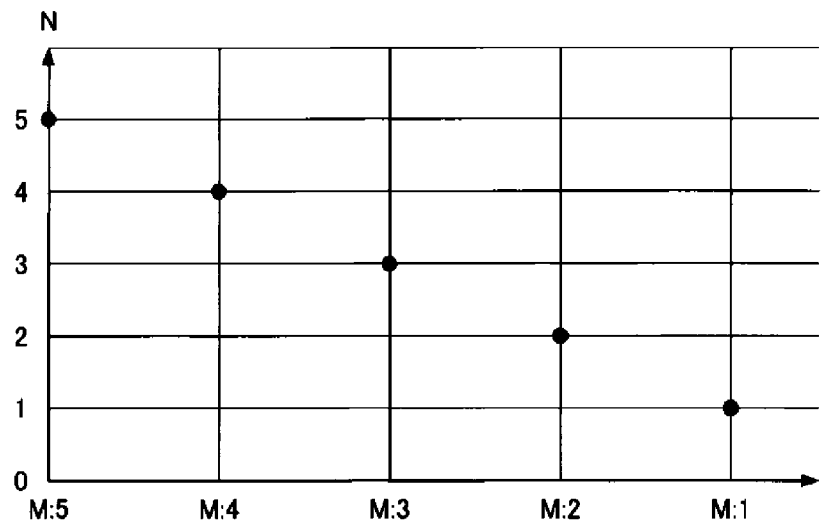
FIG. 7 is a view illustrating a relationship between a first mixing ratio (M:N) and the number of times of supply N according to the embodiment.

FIG. 7 is a view illustrating a relationship between the first mixing ratio (M:N) and the number of times of the supply N according to the embodiment. As illustrated in FIG. 7, the controller 9 controls the number of times of the supply N, so as to control the first mixing ratio (M:N). Since V×M (L) is constant, the controller 9 controls V×N (L), thereby controlling the first mixing ratio (M:N).

Figure 8:
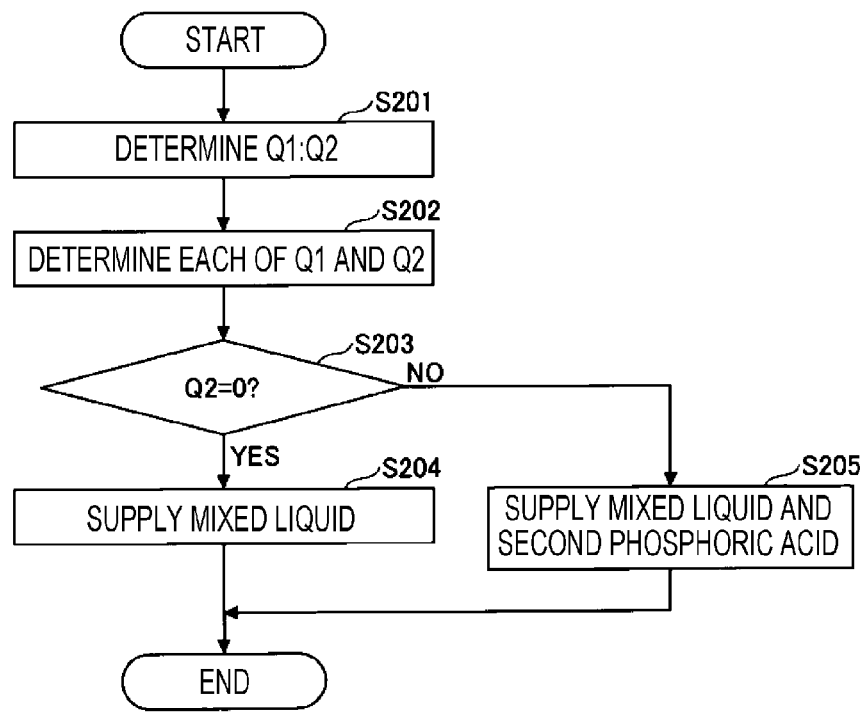
FIG. 8 is a flowchart illustrating a supply of the mixed liquid to the processing unit according to the embodiment.

FIG. 8 is a flowchart illustrating the supply of the mixed liquid to the processing units according to the embodiment. When an instruction to supply the mixed liquid to the processing units 7 is received, the controller 9 performs the processes illustrated in FIG. 8. The supply instruction is generated, for example, when the processing of the substrates 2 is started. In order to maintain the silicon concentration during the processing of the substrates 2, the previous processing liquid 3 is replaced with the new processing liquid 3.

In a case where the substrates 2 are processed in a batch manner, the supply instruction is also generated when the mixing ratio of the raw materials of the processing liquid 3, for example, the mixing ratio of the phosphoric acid (the first phosphoric acid or second phosphoric acid) and the silica precipitation inhibitor is changed, and the processing liquid 3 with the new mixing ratio is stored in the processing tank 71. In this case, before the processing liquid 3 with the new mixing ratio is stored in the processing tank 71, the processing liquid 3 with the previous mixing ratio is drained from the processing tank 71.

First, the controller 9 determines the mixing ratio of the raw materials of the processing liquid 3 based on, for example, the pattern 27 of each substrate 2 to be processed with the processing liquid 3, and determines the second mixing ratio (Q1:Q2) to implement the determined mixing ratio (S201). The flow rate Q1 of the mixed liquid is the sum of the flow rate q1 of the silica precipitation inhibitor and the flow rate q2 of the first phosphoric acid, as illustrated in FIG. 2. The flow rate ratio (q2:q1) between the first phosphoric acid and the silica precipitation inhibitor is the same as the first mixing ratio (M:N).

Figure 9:
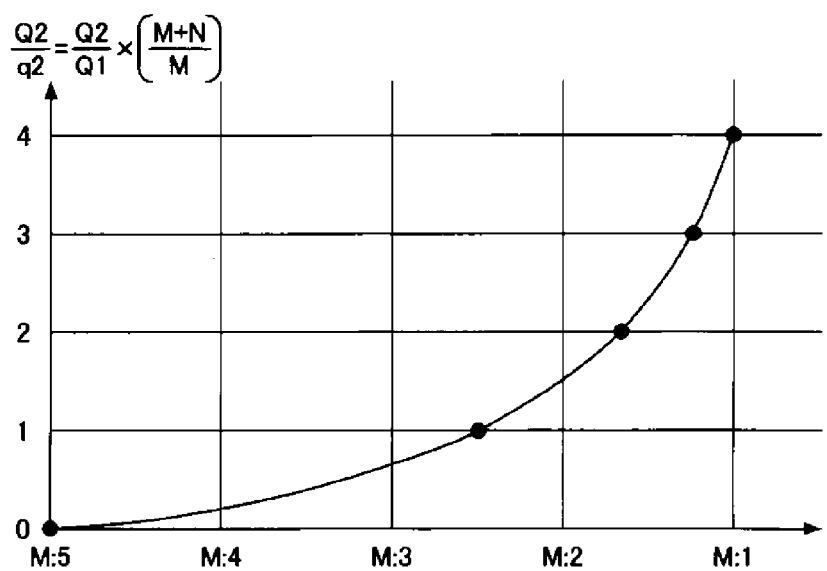
FIG. 9 is a view illustrating a relationship between the mixing ratio of the raw materials of the processing liquid and a second mixing ratio (Q2:Q1) according to the embodiment.

FIG. 9 is a view illustrating a relationship between the mixing ratio of the raw materials of the processing liquid and the second mixing ratio (Q2:Q1) according to the embodiment. As illustrated in FIG. 9, the ratio of the silica precipitation inhibitor relatively decreases as Q2/Q1 increases and Q2/q2 increases.

In addition, as described above, since the mixing ratio of the raw materials of the processing liquid 3 also depends on the processing conditions of the substrates 2 other than the pattern 27 of a substrate 2, the mixing ratio of the raw materials of the processing liquid 3 may be determined based on other processing conditions.

After the second mixing ratio (Q1:Q2) is determined, the controller 9 determines each of Q1 and Q2 (S202). Q1 and Q2 are determined according to the purpose of the supply instruction. First, descriptions will be made on a case where the purpose of the supply instruction is to maintain the silicon concentration during the processing of the substrates 2, with reference to FIG. 10.

Figure 10:
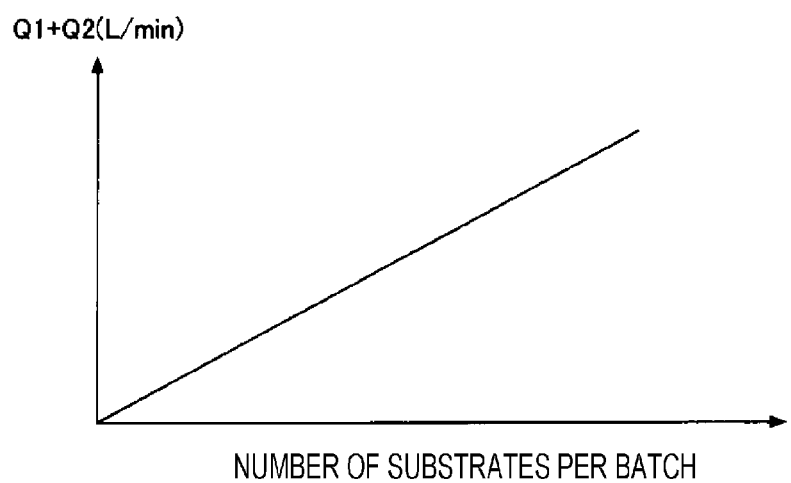
FIG. 10 is a view illustrating a relationship between the number of substrates per batch and the sum of Q1 and Q2 (Q1+Q2) according to the embodiment.

FIG. 10 is a view illustrating a relationship between the number of substrates per batch and the sum of Q1 and Q2 (Q1+Q2) according to the embodiment. Since the flow rate of silicon eluted from the substrates 2 is proportional to the number of the substrates 2, Q1+Q2 is proportional to the number of the substrates 2 as illustrated in FIG. 10.

Meanwhile, when the purpose of the supply instruction is to store the processing liquid 3 with the new mixing ratio in the processing tank 71, Q1+Q2 may be the maximum flow rate of the liquid sending line 61 in order to reduce the storing time. As described above, the maximum flow rate of the liquid sending line 61 is determined by the length or diameter of the line.

As illustrated in FIG. 8, the controller 9 checks whether Q2 is zero (S203). When it is determined that Q2 is zero (S203, YES), the supply of the second phosphoric acid is unnecessary, and thus, the controller 9 supplies only the mixed liquid to the processing units 7 (S204). Meanwhile, when it is determined that Q2 is not zero (S203, NO), the controller 9 supplies the mixed liquid and the second phosphoric acid to the processing units 7 (S205).

The supply of the mixed liquid (S204) or the supply of the mixed liquid and the second phosphoric acid (S205) is performed until the purpose of the supply instruction is achieved. Then, the controller 9 ends the present process.

The controller 9 of the embodiment described above controls the mixing ratio of the phosphoric acid and the silica precipitation inhibitor. However, the type of the additive is not limited to the silica precipitation inhibitor. For example, the controller 9 may control a mixing ratio between the phosphoric acid and the silicon concentration regulating agent. In this case, the first additive supply 53 supplies the silicon concentration regulating agent as an additive to the mixing tank 51.

The optimum value of the mixing ratio of the phosphoric acid and the silicon concentration regulating agent also differs according to the processing conditions of the substrates 2, similarly to the mixing ratio of the phosphoric acid and the silica precipitation inhibitor. For example, when the number of stacked layers of the stacked film 24 increases, the maximum value of the silicon concentration increases as described above, and hence, the optimum ratio of the silica concentration regulating agent decreases. Further, as the number of substrates 2 per batch increases, the flow rate of silicon eluted from the substrates 2 increases, and the highest value of the silicon concentration increases, so that the optimal ratio of the silica concentration regulating agent decreases.

Thus, the mixing ratio of the phosphoric acid and the silicon concentration regulating agent is also determined in advance by, for example, an experiment for each processing condition of the substrates 2, and stored in advance in the storage medium 92, similarly to the mixing ratio of the phosphoric acid and the silica precipitation inhibitor. The controller 9 determines a mixing ratio having the highest ratio of the silicon concentration regulating agent, among the plurality of mixing ratios stored in advance, to be the first mixing ratio (M:N). This is because the ratio of the silicon concentration regulating agent may be reduced by supplying the second phosphoric acid. Since the mixing ratio with the highest ratio of the silicon concentration regulating agent is determined to be the first mixing ratio (M:N), the first mixing ratio (M:N) does not need to be frequently changed, so that the waste amount of the mixed solution may be reduced.

In addition, the substrate 2 of the embodiment described above includes the silicon wafer 21, the silicon oxide film 22, and the silicon nitride film 23. However, the configuration of the substrate 2 is not particularly limited. For example, the substrate 2 may include, for example, a silicon carbide substrate, a gallium oxide substrate or a gallium nitride substrate, instead of the silicon wafer 21.

In addition, the processing unit 7 of the embodiment described above is a batch type processing unit. However, the processing unit 7 may be a single-wafer type processing unit. The single-wafer type processing unit 7 includes, for example, a spin chuck, a nozzle, and a cup. The spin chuck rotates in a state of holding a substrate. The nozzle supplies the processing liquid 3 to the substrate 2 that rotates along with the spin chuck. The processing liquid 3 is supplied to the center of the substrate 2, and spreads in the wet state radially outward across the substrate 2 by the centrifugal force. The cup collects the processing liquid 3 scattered from the outer periphery of the substrate 2.

According to an embodiment of the present disclosure, it is possible to appropriately change a mixing ratio of phosphoric acid and an additive.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing, apparatus comprising:
a processing container configured to process a substrate with a processing liquid; a mixer configured to mix a first phosphoric acid and a silica precipitation inhibitor serving as raw materials of the processing liquid with each other at a predetermined mixing ratio, thereby preparing a mixed liquid;
a mixing ratio corrector configured to correct the mixing ratio of the raw materials of the processing liquid, the mixing ratio corrector including a liquid line through which the mixed liquid is delivered from the mixer to the processing container and a second phosphoric acid supply connected to the liquid line so as to supply a second phosphoric acid to the liquid line; and
a controller configured to control a first mixing ratio of the first phosphoric acid and the silica precipitation inhibitor, and a second mixing ratio of the mixed liquid and the second phosphoric acid,
wherein the mixer includes a mixing tank that stores the mixed liquid, a first phosphoric acid supply that supplies the first phosphoric acid to the mixing tank, and a silica precipitation inhibitor supply that supplies a silica precipitation inhibitor to the mixing tank, and
the controller is configured to change at least one of the first mixing ratio and the second mixing ratio, based on a processing condition of the substrate to change a concentration of the silica precipitation inhibitor included in the processing liquid supplied to the substrate in the processing container.

2. The substrate processing apparatus according to claim 1, wherein the processing condition of the substrate relates to a pattern of the substrate to be processed with the processing liquid.

3. The substrate processing apparatus according to claim 1, wherein the mixer includes a plurality of mixing tanks.

4. The substrate processing apparatus according to claim 3, wherein while taking a prepared mixed liquid out from one of the mixing tanks and sending the prepared mixed liquid to the processing container, the controller prepares the mixed liquid in another one of the mixing tanks.

5. The substrate processing apparatus according to claim 3, wherein the controller switches an order of sending the prepared mixed liquid to the processing container, among the plurality of mixing tanks in a predetermined order.

6. The substrate processing apparatus according to claim 1, wherein a plurality of processing containers is provided, and
the liquid line includes individual lines that individually send the mixed liquid to the processing containers.

7. The substrate processing apparatus according to claim 1, wherein the mixing ratio corrector includes a buffer tank connected to the liquid line to temporarily store the mixed liquid and the second phosphoric acid.

8. The substrate processing apparatus according to claim 7, wherein the mixing ratio corrector includes a circulation line that returns the processing liquid taken out from the buffer tank to the buffer tank.

9. The substrate processing apparatus according to claim 1, wherein the mixer further includes a mixing tank circulation line configured to return the mixed liquid taken from the mixing tank to the mixing tank.

10. A substrate processing method, comprising:
mixing a first phosphoric acid and a silica precipitation inhibitor serving as raw materials of a processing liquid with each other at a predetermined first mixing ratio, thereby preparing a mixed liquid;
correcting the mixing ratio of the raw materials of the processing liquid using a mixing ratio corrector by mixing the mixed liquid and a second phosphoric acid with each other within a mixer at a predetermined second mixing ratio; delivering the processing liquid having the corrected mixing ratio from the mixer to a processing container;
processing a substrate with the processing liquid in the processing container; and
providing a controller configured to change at least one of the first mixing ratio and the second mixing ratio based on a processing condition of the substrate, and operating the controller which is configured to change at least one of the first mixing ratio and the second mixing ratio to change a concentration of the silica precipitation inhibitor included in the processing liquid supplied to the substrate.

11. The substrate processing method according to claim 10, wherein the processing condition of the substrate relates to a pattern of the substrate to be processed with the processing liquid.

12. The substrate processing method according to claim 10, further comprising:
while taking a prepared mixed liquid out from one mixing tank and sending the prepared mixed liquid to a processing container configured to process the substrate, preparing the mixed liquid in another mixing tank.

13. The substrate processing method according to claim 10, further comprising:
switching an order of sending the prepared mixed liquid to the processing container configured to process the substrate, among the plurality of mixing tanks in a predetermined order.

14. The substrate processing method according to claim 10, wherein the substrate includes a stacked film in which a silicon oxide film and a silicon nitride film are alternately stacked,
the stacked film includes an opening that penetrates the stacked film in a thickness direction, and
the processing liquid selectively etches the silicon nitride film.

15. A substrate processing apparatus comprising:
a processing container configured to process a substrate with a processing liquid;
a mixer configured to mix a first phosphoric acid and a silica precipitation inhibitor serving as raw materials of the processing liquid with each other at a predetermined mixing ratio, thereby preparing a mixed liquid;
a mixing ratio corrector configured to correct the mixing ratio of the raw materials of the processing liquid, the mixing ratio corrector including a liquid line through which the mixed liquid is delivered from the mixer to the processing container and a second phosphoric acid supply connected to the liquid line so as to supply a second phosphoric acid to the liquid line; and
a controller configured to control a first mixing ratio of the first phosphoric acid and the silica precipitation inhibitor, and a second mixing ratio of the mixed liquid and the second phosphoric acid,
wherein the mixer includes a plurality of mixing tanks that store the mixed liquid, a first phosphoric acid supply that supplies the first phosphoric acid to each mixing tank, and a silica precipitation inhibitor supply that supplies a silica precipitation inhibitor to each mixing tank, and the controller is configured to change at least one of the first mixing ratio and the second mixing ratio, based on a processing condition of the substrate the controller is also configured to change a concentration of the silica precipitation inhibitor included in the processing liquid supplied to the substrate in the processing container.

16. The substrate processing apparatus according to claim 15, wherein each mixing tank includes a mixing tank circulation line configured to return the mixed liquid taken from the mixing tank to the mixing tank, each mixing tank circulation line being connected to the liquid line.

* * * * *